(12) United States Patent
Asano et al.

(10) Patent No.: US 10,411,148 B2
(45) Date of Patent: Sep. 10, 2019

(54) PHOTOELECTRIC CONVERSION ELEMENT

(71) Applicant: SHARP KABUSHIKI KAISHA, Sakai, Osaka (JP)

(72) Inventors: Naoki Asano, Sakai (JP); Takeshi Hieda, Sakai (JP); Chikao Okamoto, Sakai (JP); Yuta Matsumoto, Sakai (JP); Kenichi Higashi, Sakai (JP); Hiroaki Shigeta, Sakai (JP)

(73) Assignee: SHARP kABUSHIKI KAISHA, Sakai, Osaka (JP)

( * ) Notice: Subject to any disclaimer, the term of this patent is extended or adjusted under 35 U.S.C. 154(b) by 140 days.

(21) Appl. No.: 15/127,221

(22) PCT Filed: Feb. 12, 2015

(86) PCT No.: PCT/JP2015/053803
§ 371 (c)(1),
(2) Date: Sep. 19, 2016

(87) PCT Pub. No.: WO2015/146333
PCT Pub. Date: Oct. 1, 2015

(65) Prior Publication Data
US 2017/0125622 A1 May 4, 2017

(30) Foreign Application Priority Data
Mar. 25, 2014 (JP) .................. 2014-061818

(51) Int. Cl.
*H01L 31/056* (2014.01)
*H01L 31/0224* (2006.01)
(Continued)

(52) U.S. Cl.
CPC ...... *H01L 31/056* (2014.12); *H01L 31/02363* (2013.01); *H01L 31/022441* (2013.01); *H01L 31/0747* (2013.01); *Y02E 10/52* (2013.01)

(58) Field of Classification Search
CPC ............ H01L 31/056; H01L 31/02363; H01L 31/022441; H01L 31/0747
See application file for complete search history.

(56) References Cited

U.S. PATENT DOCUMENTS 5,641,362 A * 6/1997 Meier ............... H01L 31/02244
136/255
7,339,110 B1 * 3/2008 Mulligan ........ H01L 31/022441
136/256
(Continued)

FOREIGN PATENT DOCUMENTS

JP 2009-524916 A 7/2009
JP 2010-80887 4/2010
(Continued)

OTHER PUBLICATIONS

International Search Report for PCT/JP2015/053803, dated Mar. 24, 20015, 4 pages.

*Primary Examiner* — Allison Bourke
(74) *Attorney, Agent, or Firm* — ScienBiziP, P.C.

(57) ABSTRACT

Provided are a photoelectric conversion element capable of enhancing characteristics and reliability more than ever before and a method for manufacturing the photoelectric conversion element. The photoelectric conversion element includes a base including a semiconductor substrate, a first i-type semiconductor film placed on a portion of a surface of the semiconductor substrate, a first conductivity-type semiconductor film placed on the first i-type semiconductor film, a second i-type semiconductor film placed on another portion of the surface thereof, and a second conductivity-type semiconductor film placed on the second i-type semiconductor film; an electrode section including a first electrode layer placed on the first conductivity-type semiconductor film and a second electrode layer placed on the second conductivity-type semiconductor film; and a reflective sec- (Continued)

tion placed in a gap region A interposed between the first electrode layer and the second electrode layer.

7 Claims, 5 Drawing Sheets

(51) Int. Cl.
  *H01L 31/0747* (2012.01)
  *H01L 31/0236* (2006.01)

(56) References Cited

U.S. PATENT DOCUMENTS

| | | | |
|---|---|---|---|
| 8,962,380 B2* | 2/2015 | Moslehi | H01L 31/035281 |
| | | | 438/98 |
| 2007/0169808 A1* | 7/2007 | Kherani | H01L 31/0745 |
| | | | 136/258 |
| 2008/0061293 A1* | 3/2008 | Ribeyron | H01L 31/022433 |
| | | | 257/53 |
| 2012/0273036 A1* | 11/2012 | Motoyoshi | H01L 31/0682 |
| | | | 136/255 |
| 2012/0279562 A1 | 11/2012 | Yang et al. | |
| 2013/0102107 A1 | 4/2013 | Hirose et al. | |
| 2013/0164879 A1* | 6/2013 | Cousins | H01L 31/02168 |
| | | | 438/71 |
| 2013/0247970 A1* | 9/2013 | Morigami | H01L 31/022441 |
| | | | 136/256 |

FOREIGN PATENT DOCUMENTS

| | | |
|---|---|---|
| JP | 2012-99566 | 5/2012 |
| JP | 2012-109413 | 6/2012 |
| JP | 2012-119537 | 6/2012 |
| JP | 2012-238853 | 12/2012 |
| JP | 2013-513966 | 4/2013 |
| JP | 2014-22544 | 2/2014 |
| TW | 201310690 A | 3/2013 |
| WO | WO 2007/085072 | 8/2007 |
| WO | WO 2012/029847 | 3/2012 |
| WO | 2013/020867 A1 | 2/2013 |

* cited by examiner

PHOTOELECTRIC CONVERSION ELEMENT

This application is the U.S. national phase of International Application No. PCT/JP2015/053803 filed 12 Feb. 2015, which designated the U.S. and claims priority to JP Patent Application No. 2014-061818 filed 25 Mar. 2014, the entire contents of each of which are hereby incorporated by reference.

TECHNICAL FIELD

The present invention relates to a photoelectric conversion element.

BACKGROUND ART

In recent years, solar cells directly converting solar energy into electrical energy have been increasingly expected as next-generation energy sources particularly from the viewpoint of global environmental issues. Though there are various types of solar cells such as those made of a compound semiconductor or an organic material, those made of crystalline silicon are currently mainstream.

The solar cells are classified into those having a structure (double-sided electrode structure) in which an electrode is placed on each of a light-receiving surface on which sunlight is incident and a back surface opposite to the light-receiving surface and those having a structure (back electrode structure) in which an electrode is placed only on a back surface. A solar cell with a back electrode structure is advantageous in that the amount of incident sunlight can be increased because no electrode is present on a light-receiving surface.

For example, Patent Literature 1 describes a solar cell with a back electrode structure. According to the solar cell described in Patent Literature 1, an in junction and an ip junction are placed on the back surface of a semiconductor substrate, an n-side electrode is placed on the in junction, and a p-side electrode is placed on the ip junction. In the solar cell, sunlight is incident on a light-receiving surface of the semiconductor substrate and therefore carriers are generated in the semiconductor substrate. The carriers are extracted outside through the p-side electrode and the n-side electrode.

CITATION LIST

Patent Literature

PTL 1: Japanese Unexamined Patent Application Publication No. 2010-80887

SUMMARY OF INVENTION

Technical Problem

However, in recent years, in the technical field of photoelectric conversion elements such as solar cells, the enhancement of characteristics and reliability has been strongly demanded and has been under investigation.

In view of the above circumstances, it is an object of the present invention to provide a photoelectric conversion element capable of enhancing characteristics and reliability and a method for manufacturing the photoelectric conversion element.

Solution to Problem

According to a first embodiment of the present invention, the following element can be provided: a photoelectric conversion element including a base including a semiconductor substrate, a first i-type semiconductor film placed on a portion of a surface of the semiconductor substrate, a first conductivity-type semiconductor film placed on the first i-type semiconductor film, a second i-type semiconductor film placed on another portion of the surface thereof, and a second conductivity-type semiconductor film placed on the second i-type semiconductor film; an electrode section including a first electrode layer placed on the first conductivity-type semiconductor film and a second electrode layer placed on the second conductivity-type semiconductor film; and a reflective section placed in a gap region interposed between the first electrode layer and the second electrode layer.

Advantageous Effect of Invention

According to the present invention, a photoelectric conversion element capable of enhancing characteristics and reliability more than ever before can be provided.

DESCRIPTION OF EMBODIMENTS

Figure 1:
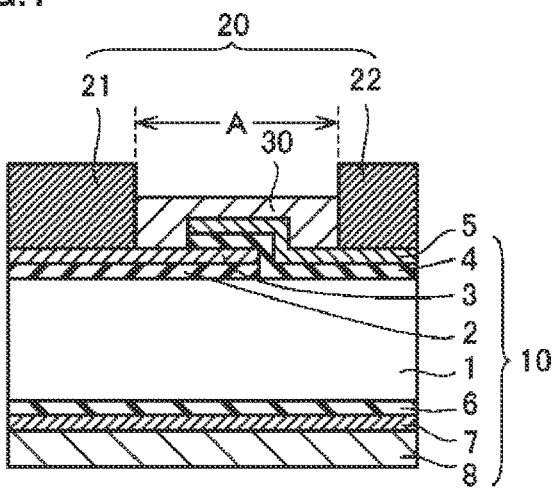
FIG. 1 is a schematic sectional view of a heterojunction back-contact cell according to Embodiment 1.

An embodiment that is an example of the present invention is described below. In drawings used to describe the embodiment, the same reference numerals will represent the same parts or corresponding parts.

[Embodiment 1]

(Configuration of Photoelectric Conversion Element)

FIG. 1 shows a schematic sectional view of a heterojunction back-contact cell according to Embodiment 1 that is an example of a photoelectric conversion element according to the present invention.

The heterojunction back-contact cell according to Embodiment 1 includes a base 10, an electrode section 20, and a reflective section 30 composed of an insulating layer.

The base 10 includes a semiconductor substrate 1 composed of an n-type single-crystalline silicon substrate, a first i-type semiconductor film 2 placed on a portion of a surface (back surface) of the semiconductor substrate 1, and a first conductivity-type semiconductor film 3 which is placed on the first i-type semiconductor film 2 and which is composed of a p-type amorphous silicon film. Furthermore, the base 10 includes a second i-type semiconductor film 4 placed on another portion of the back surface of the semiconductor substrate 1 and a first second-conductivity-type semiconductor film 5 which is placed on the second i-type semiconductor film 4 and which is composed of an n-type amorphous silicon film.

The base 10 further includes a third i-type semiconductor film 6 placed on another surface (light-receiving surface) of the semiconductor substrate 1, a second second-conductivity-type semiconductor film 7 placed on the third i-type semiconductor film 6, and an antireflective film 8 placed on the second second-conductivity-type semiconductor film 7.

That is, as shown in FIG. 1, the first conductivity-type semiconductor film 3 and the first second-conductivity-type semiconductor film 5 are located above a surface (back surface) of the base 10 and the antireflective film 8 is located under another surface (light-receiving surface) of the base 10.

The electrode section 20 includes a first electrode layer 21 placed on the first conductivity-type semiconductor film 3 of the base 10 and a second electrode layer 22 placed on the first second-conductivity-type semiconductor film 5.

The reflective section 30 is composed of an insulating layer placed in a gap region A interposed between the first electrode layer 21 and the second electrode layer 22. In particular, in Embodiment 1, the reflective section 30 is placed in a region which is the gap region A and which is surrounded by surfaces of the first and second electrode layers 21 and 22 that face each other and the back surface of the base 10 that is located between the first and second electrode layers 21 and 22.

An n-type single-crystalline silicon substrate can be preferably used as the semiconductor substrate 1. The semiconductor substrate 1 is not limited to the n-type single-crystalline silicon substrate and may be a conventionally known semiconductor substrate. The thickness of the semiconductor substrate 1 is not particularly limited and may be, for example, 50 μm to 300 μm. The thickness thereof is preferably 100 μm to 200 μm. The resistivity of the semiconductor substrate 1 is not particularly limited and may be, for example, 0.1 Ω·cm to 10 Ω·cm. The impurity concentration of an n-type impurity may be, for example, $1 \times 10^{15}$ atoms/cm$^3$ to $1 \times 10^{16}$ atoms/cm$^3$.

An i-type amorphous silicon film can be preferably used as the first i-type semiconductor film 2. The first i-type semiconductor film 2 is not limited to the i-type amorphous silicon film and may be, for example, a conventionally known i-type semiconductor film. The thickness of the first i-type semiconductor film 2 is not particularly limited and may be, for example, 5 nm to 50 nm.

In this specification, the term "i type" includes not only a complete intrinsic state but also a state that an n- or p-type impurity is incorporated at a sufficiently low concentration (the concentration of an n-type impurity is less than $1 \times 10^{15}$ atoms/cm$^3$ and the concentration of a p-type impurity is less than $1 \times 10^{15}$ atoms/cm$^3$). The concentration of an n-type impurity and the concentration of a p-type impurity can be measured by secondary ion mass spectrometry (SIMS).

In this specification, the term "amorphous silicon" includes not only amorphous silicon in which dangling bonds of silicon atoms are not terminated with hydrogen but also hydrogenated amorphous silicon in which dangling bonds of silicon atoms are terminated with hydrogen.

A p-type amorphous silicon film can be preferably used as the first conductivity-type semiconductor film 3. The first conductivity-type semiconductor film 3 is not limited to the p-type amorphous silicon film and may be, for example, a conventionally known p-type semiconductor film. A p-type impurity contained in the first conductivity-type semiconductor film 3 may be, for example, boron. The concentration of the p-type impurity may be, for example, about $5 \times 10^{19}$ atoms/cm$^3$. The thickness of the first conductivity-type semiconductor film 3 is not particularly limited and may be, for example, 5 nm to 50 nm.

An i-type amorphous silicon film can be preferably used as the second i-type semiconductor film 4. The second i-type semiconductor film 4 is not limited to the i-type amorphous silicon film and may be, for example, a conventionally known i-type semiconductor film. The thickness of the second i-type semiconductor film 4 is not particularly limited and may be, for example, 5 nm to 50 nm.

An n-type amorphous silicon film can be preferably used as the first second-conductivity-type semiconductor film 5. The first second-conductivity-type semiconductor film 5 is not limited to the n-type amorphous silicon film and may be, for example, a conventionally known n-type semiconductor film. An n-type impurity contained in the first second-conductivity-type semiconductor film 5 may be, for example, phosphorus. The thickness of the first second-conductivity-type semiconductor film 5 is not particularly limited and may be, for example, 5 nm to 50 nm.

An i-type amorphous silicon film can be preferably used as the third i-type semiconductor film 6. The third i-type semiconductor film 6 is not limited to the i-type amorphous silicon film and may be, for example, a conventionally known i-type semiconductor film. The thickness of the third i-type semiconductor film 6 is not particularly limited and may be, for example, 5 nm to 50 nm.

An n-type amorphous silicon film can be preferably used as the second second-conductivity-type semiconductor film 7. The second second-conductivity-type semiconductor film 7 is not limited to the n-type amorphous silicon film and may be, for example, a conventionally known n-type semiconductor film. An n-type impurity contained in the second second-conductivity-type semiconductor film 7 may be, for example, phosphorus. The concentration of the n-type impurity may be, for example, about $5 \times 10^{19}$ atoms/cm$^3$. The thickness of the second second-conductivity-type semiconductor film 7 is not particularly limited and may be, for example, 5 nm to 50 nm.

For example, at least one of an oxide layer or a nitride layer can be used as the antireflective film 8. For example, a silicon oxide layer can be used as the oxide layer. For example, a silicon nitride layer can be used as the nitride layer. Thus, for example, a single silicon oxide layer, a single silicon nitride layer, a stack of a silicon oxide layer and a silicon nitride layer, or the like can be used as the antireflective film 8. The thickness of the antireflective film 8 may be, for example, 100 nm to 800 nm.

A conductive material can be used for the first electrode layer 21 and the second electrode layer 22 without limitation. In particular, at least one of aluminium and silver is preferably used. The thickness of each of the first electrode layer 21 and second electrode layer 22 is not particularly limited and may be, for example, 0.5 μm or less.

The reflective section 30, which is the insulating layer, is a reflective member for introducing light that travels from the light-receiving surface to the back surface of the base 10 to reach somewhere between the first electrode layer 21 and the second electrode layer 22 into the base 10 again. Herein, the term "insulating layer" refers to a layer having such insulation performance that the first electrode layer 21 and the second electrode layer 22 are not short-circuited even in the case where a portion of the insulating layer is in contact with the first electrode layer 21 and another portion of the insulating layer is in contact with the second electrode layer 22. In general, a sheet resistance of 1,000Ω/square or more is sufficient to suppress such short-circuiting as described above.

Furthermore, the reflective section 30 has reflection performance. The reflection performance of the reflective section 30 refers to performance that the presence of the reflective section 30 enables the reflectance of light reaching somewhere between the first electrode layer 21 and the second electrode layer 22 to be increased as compared to the absence of reflective section 30. Thus, the reflective section 30 may have, for example, a refractive index different from that of each of the first conductivity-type semiconductor film 3 and the first second-conductivity-type semiconductor film 5. The reflective section 30 preferably has a refractive index less than that of each of the first conductivity-type semiconductor film 3 and the first second-conductivity-type semiconductor film 5. In this case, the reflectance of the above light can be effectively increased.

Resin, a nitride, an oxide, and the like can be cited as a material, satisfying such insulation performance and reflection performance, for the reflective section 30. The resin is preferably ethylene-vinyl acetate or the like. The nitride is preferably silicon nitride or the like. The oxide is preferably silicon oxide or the like.

The thickness of the reflective section 30 is not particularly limited and may be sufficient to reflect light. In other words, the thickness thereof may be sufficient to prevent the escape of light due to a quantum effect. In in-plane directions (a lateral direction in FIG. 1 and a direction extending vertically through the plane of the figure) of the back surface of the base 10, the thickness of the reflective section 30 may vary. The reflective section 30 preferably has a thickness of 5 nm or more at the thinnest position (for example, on a region where the first conductivity-type semiconductor film 3 and the first second-conductivity-type semiconductor film 5 overlap each other in FIG. 1), more preferably 20 nm or more, and further more preferably 50 nm or more. When the thickness thereof is less than 5 nm, a reflection effect of the reflective section 30 tends to be low. In terms of the ease of modularization, the thickness of the reflective section 30 is preferably 0.5 μm or less.

(Method for Manufacturing Photoelectric Conversion Element)

An example of a method for manufacturing the heterojunction back-contact cell according to Embodiment 1 is described below with reference to schematic sectional views shown in FIGS. 2 to 11.

Figure 2:
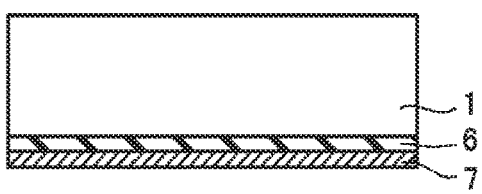
FIG. 2 is a schematic sectional view illustrating an example of a method for manufacturing the heterojunction back-contact cell according to Embodiment 1.

First, as shown in FIG. 2, the third i-type semiconductor film 6 is formed over the light-receiving surface of the semiconductor substrate 1 and the second second-conductivity-type semiconductor film 7 is then formed over the light-receiving surface of the third i-type semiconductor film 6.

A method for forming each of the third i-type semiconductor film 6 and the second second-conductivity-type semiconductor film 7 is not particularly limited and may be, for example, a plasma CVD (chemical vapor deposition) method.

Incidentally, before the third i-type semiconductor film 6 is formed over the light-receiving surface of the semiconductor substrate 1, irregularities may be formed on the light-receiving surface of the semiconductor substrate 1. The irregularities can be formed in such a manner that, for example, after a texture mask is formed over the back surface of the semiconductor substrate 1, the light-receiving surface of the semiconductor substrate 1 is texture-etched. For example, silicon nitride or silicon oxide can be used as the texture mask. For example, an alkali solution capable of dissolving silicon can be used as an etchant used for texture etching.

Figure 3:
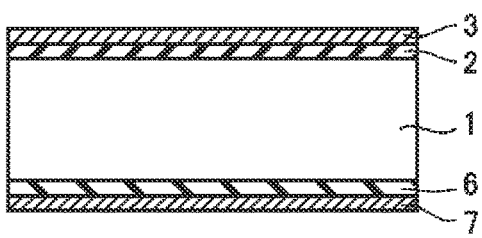
FIG. 3 is a schematic sectional view illustrating an example of the method for manufacturing the heterojunction back-contact cell according to Embodiment 1.

Next, as shown in FIG. 3, the first i-type semiconductor film 2 is formed over the back surface of the semiconductor substrate 1 and the first conductivity-type semiconductor film 3 is then formed on the first i-type semiconductor film 2. A method for forming each of the first i-type semiconductor film 2 and the first conductivity-type semiconductor film 3 is not particularly limited and may be, for example, a plasma CVD method.

Figure 4:
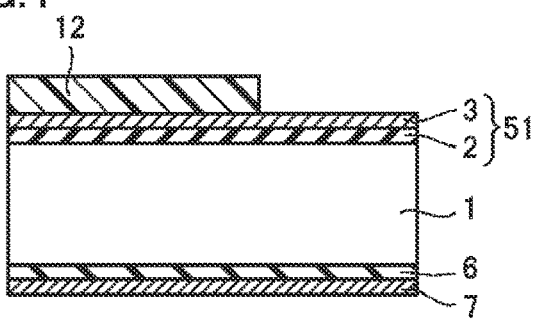
FIG. 4 is a schematic sectional view illustrating an example of the method for manufacturing the heterojunction back-contact cell according to Embodiment 1.

Next, as shown in FIG. 4, in the back surface of the semiconductor substrate 1, an etching mask 12 such as a photoresist is formed only on a portion where a stack 51 of the first i-type semiconductor film 2 and the first conductivity-type semiconductor film 3 is to be left.

Figure 5:
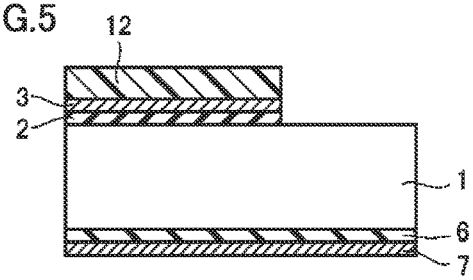
FIG. 5 is a schematic sectional view illustrating an example of the method for manufacturing the heterojunction back-contact cell according to Embodiment 1.

Next, as shown in FIG. 5, the stack 51 of the first i-type semiconductor film 2 and the first conductivity-type semiconductor film 3 is partly wet-etched in a thickness direction using the etching mask 12 as a mask. This allows a surface of the semiconductor substrate 1 to be exposed. The stack 51 may be partly removed by laser irradiation instead of etching using the etching mask 12 as a mask.

Figure 6:
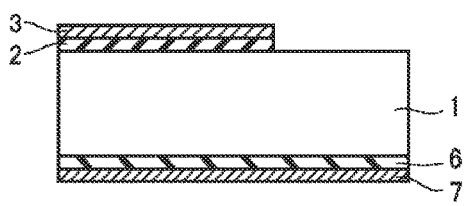
FIG. 6 is a schematic sectional view illustrating an example of the method for manufacturing the heterojunction back-contact cell according to Embodiment 1.

Next, as shown in FIG. 6, the etching mask 12 is completely removed from the first conductivity-type semiconductor film 3.

Figure 7:
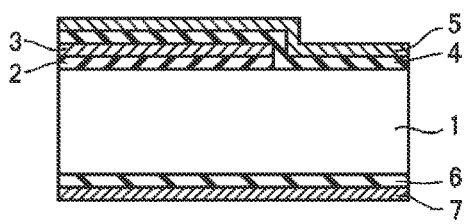
FIG. 7 is a schematic sectional view illustrating an example of the method for manufacturing the heterojunction back-contact cell according to Embodiment 1.

Next, as shown in FIG. 7, the second i-type semiconductor film 4 is formed so as to cover an exposed portion of the back surface of the semiconductor substrate 1 and the first second-conductivity-type semiconductor film 5 is then formed on the second i-type semiconductor film 4. A method for forming each of the second i-type semiconductor film 4 and the first second-conductivity-type semiconductor film 5 is not particularly limited and may be, for example, a plasma CVD method.

Figure 8:
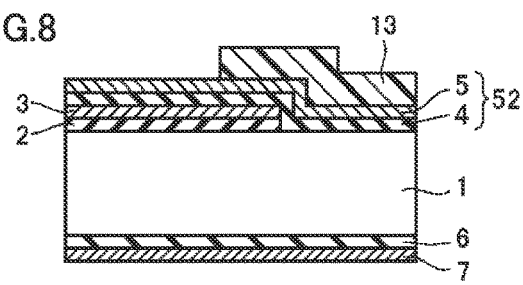
FIG. 8 is a schematic sectional view illustrating an example of the method for manufacturing the heterojunction back-contact cell according to Embodiment 1.

Next, as shown in FIG. 8, an etching mask 13 such as a photoresist is formed only on a portion which is on the back surface side of the semiconductor substrate 1 and where a stack 52 of the second i-type semiconductor film 4 and the first second-conductivity-type semiconductor film 5 is to be left.

Figure 9:
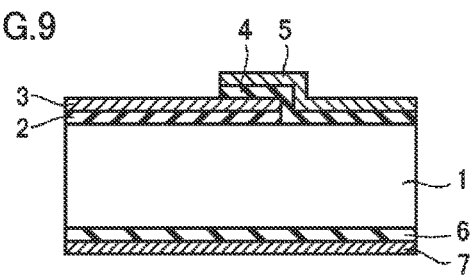
FIG. 9 is a schematic sectional view illustrating an example of the method for manufacturing the heterojunction back-contact cell according to Embodiment 1.

Next, as shown in FIG. 9, the stack 52 of the second i-type semiconductor film 4 and the first second-conductivity-type semiconductor film 5 is partly etched in a thickness direction using the etching mask 13 as a mask and the etching mask 13 is then completely removed, whereby the first conductivity-type semiconductor film 3 is partly exposed.

Figure 10:
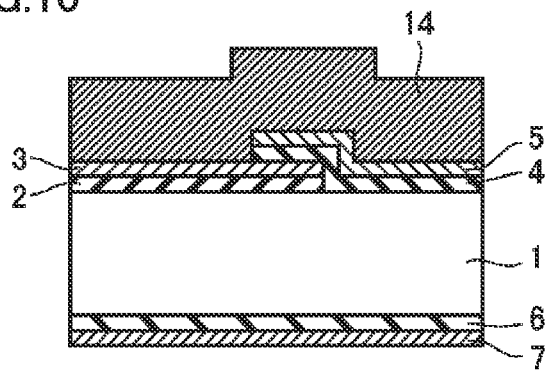
FIG. 10 is a schematic sectional view illustrating an example of the method for manufacturing the heterojunction back-contact cell according to Embodiment 1.

Next, as shown in FIG. 10, a metal layer 14 is formed over the back surface of the first conductivity-type semiconductor film 3 and the back surface of the first second-conductivity-type semiconductor film 5. A method for forming the metal layer 14 is not particularly limited and may be, for example, a sputtering method, a vapor deposition method, or the like.

Figure 11:
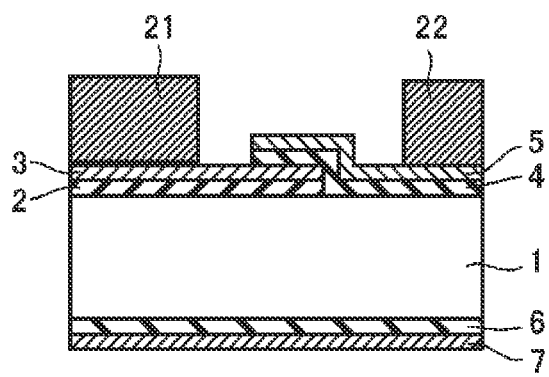
FIG. 11 is a schematic sectional view illustrating an example of the method for manufacturing the heterojunction back-contact cell according to Embodiment 1.

Next, as shown in FIG. 11, the metal layer 14 is partly removed, whereby the first electrode layer 21 and the second electrode layer 22 are formed.

A method for removing the metal layer 14 is not particularly limited. The metal layer 14 excluding the first electrode layer 21 and the second electrode layer 22 can be removed in such a manner that, for example, an etching mask is placed on each of the first electrode layer 21 and the second electrode layer 22, followed by dry etching in a thickness direction of the metal layer 14. Alternatively, the first electrode layer 21 and the second electrode layer 22 may be formed by, for example, laser irradiation.

Figure 12:
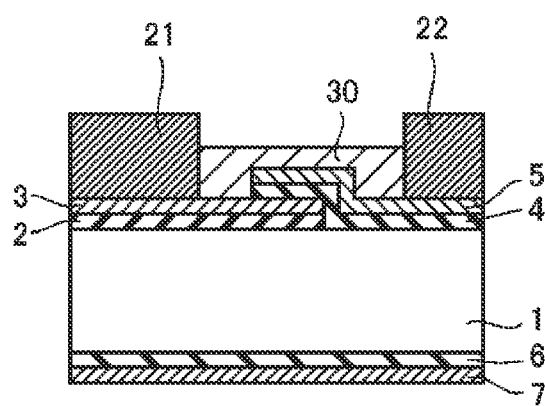
FIG. 12 is a schematic sectional view illustrating an example of the method for manufacturing the heterojunction back-contact cell according to Embodiment 1.

Next, as shown in FIG. 12, in the gap region A, the reflective section 30, which is composed of the insulating layer, is formed in the region surrounded by the surfaces of the first and second electrode layers 21 and 22 that face each other and the back surface of the base 10 that is located between the first and second electrode layers 21 and 22.

A method for forming the reflective section 30 is not particularly limited and may be appropriately selected depending on a material making up the reflective section 30. When the reflective section 30 is made of, for example, resin, the resin may be applied to the gap region A using a blade or the like. When the reflective section 30 is made of, for example, a nitride such as silicon nitride, the reflective section 30 can be readily formed by, for example, a plasma CVD method, an atmospheric pressure CVD method, or the like. When the reflective section 30 is made of, for example, an oxide such as silicon oxide, for example, a plasma CVD method, an atmospheric pressure CVD method, or the like can be used.

Next, as shown in FIG. 1, the antireflective film 8 is formed on the second second-conductivity-type semiconductor film 7.

A method for forming the antireflective film 8 is not particularly limited and may be, for example, a steam oxidation method, an atmospheric pressure CVD method, the application/firing of SOG, a plasma CVD method, or an atmospheric pressure CVD method. In particular, a silicon oxide layer can be readily formed by the steam oxidation method, the atmospheric pressure CVD method, or the application/firing of SOG and a silicon nitride layer can be readily formed by the plasma CVD method or the atmospheric pressure CVD method.

As described above, the heterojunction back-contact cell according to Embodiment 1 is completed so as to have a configuration shown in FIG. 1.

(Action Effect)

In Embodiment 1, the reflective section 30, which is composed of the insulating layer, is placed in the gap region A, which is interposed between the first electrode layer 21 and the second electrode layer 22. This allows the heterojunction back-contact cell according to Embodiment 1 to have enhanced characteristics and reliability. This is described in comparison to a conventional configuration.

Regarding a heterojunction back-contact cell, as disclosed in Patent Literature 1, an in junction and an ip junction have been exposed between an n-side electrode and p-side electrode placed on the back surface of a semiconductor substrate to face outward. That is, in a photoelectric conversion element, silicon semiconductors such as a semiconductor substrate, an in junction, and a pn junction have been located in a gap region interposed between an n-side electrode and a p-side electrode.

Since the light transmittance of a silicon semiconductor is very high as compared to the light transmittance of a metal making up an electrode, a gap region containing no electrode has not had any function of reflecting light passing through the photoelectric conversion element from a light-receiving surface side. Therefore, when light entering the photoelectric conversion element from the light-receiving surface side reaches the back surface of the photoelectric conversion element, most of the light escapes from the photoelectric conversion element at present in the case where the location is the gap region.

However, in accordance with the heterojunction back-contact cell according to Embodiment 1, since the reflective section 30 is placed in the gap region A, light reaching the back surface of the base 10 that is located in the gap region A from the light-receiving surface of the base 10 can be reflected. That is, the reflective section 30 can reflect light escaping from the gap region A into the base 10. Thus, the heterojunction back-contact cell according to Embodiment 1 can more efficiently use light as compared to conventional ones and therefore, as a result, is capable of having high photoelectric conversion efficiency; hence, the heterojunction back-contact cell has enhanced characteristics and reliability.

In Embodiment 1, the reflective section 30 is preferably placed over the gap region A. That is, the reflective section 30 is preferably placed over the back surface of the base 10 that is located between the first electrode layer 21 and the second electrode layer 22. This enables the photoelectric conversion efficiency to be further increased.

In Embodiment 1, the reflective section 30 is preferably in contact with the base 10 located in the gap region A. That is, the reflective section 30 is preferably in direct contact with the back surface of the base 10 that is located in the gap region A with no space, such as an air layer, therebetween. This enables the effect of reflecting light to be increased. This is because when a gas-containing space such as an air layer is present between two substances, light tends to attenuate in the space.

[Embodiment 2]

(Configuration of Photoelectric Conversion Element)

Figure 13:
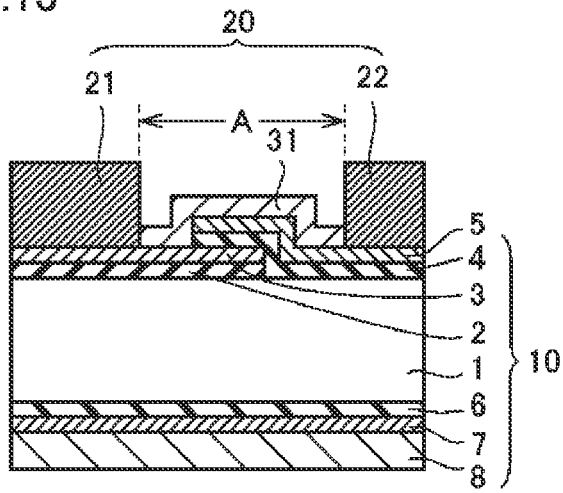
FIG. 13 is a schematic sectional view of a heterojunction back-contact cell according to Embodiment 2.

FIG. 13 shows a schematic sectional view of a heterojunction back-contact cell according to Embodiment 2 that is an example of a photoelectric conversion element according to the present invention.

The heterojunction back-contact cell according to Embodiment 2 is characterized by including a reflective section 31 having a surface, exposed to the back surface side of the photoelectric conversion element, having a step instead of the reflective section 30 described in Embodiment 1. Features of the reflective section 31 are substantially the same as those described in Embodiment 1 except the shape thereof and are not repeatedly described.

(Method for Manufacturing Photoelectric Conversion Element)

The heterojunction back-contact cell according to Embodiment 2 can be manufactured by the manufacturing method described in Embodiment 1 in such a manner that the thickness of the reflective section 31 is controlled in a step of providing the reflective section 30. For example, when a base 10 has back surface with a stepped shape as shown in FIG. 12, a film with a constant thickness is formed by a plasma CVD method or the like, whereby the reflective section 31 can be formed so as to have a step following the shape of the back surface of the base 10.

(Action Effect)

In Embodiment 2, the reflective section 31 is composed of an insulating layer and is placed in a gap region A interposed between a first electrode layer 21 and a second electrode layer 22. In particular, a surface of the reflective section 31 that is exposed to the back surface side of the photoelectric conversion element has a step. This allows the heterojunction back-contact cell according to Embodiment 2 to have enhanced characteristics and reliably.

That is, in accordance with the heterojunction back-contact cell according to Embodiment 2, as well as Embodiment 1, since the reflective section 31 is placed in the gap region A, light reaching the back surface of the base 10 that is located in the gap region A from the light-receiving surface of the base 10 can be reflected. Furthermore, since the surface of the reflective section 31 that is exposed to the back surface side of the photoelectric conversion element has the step, light can be diffusely reflected by the stepped structure. Thus, a reflective effect of the reflective section 31 is further increased, thereby allowing the heterojunction back-contact cell to have further enhanced characteristics and reliability.

Embodiment 2 is substantially the same as Embodiment 1 except having the reflective section 31 instead of the reflective section 30 and therefore a similar description is not repeated.

[Embodiment 3]

(Configuration of Photoelectric Conversion Element)

Figure 14:
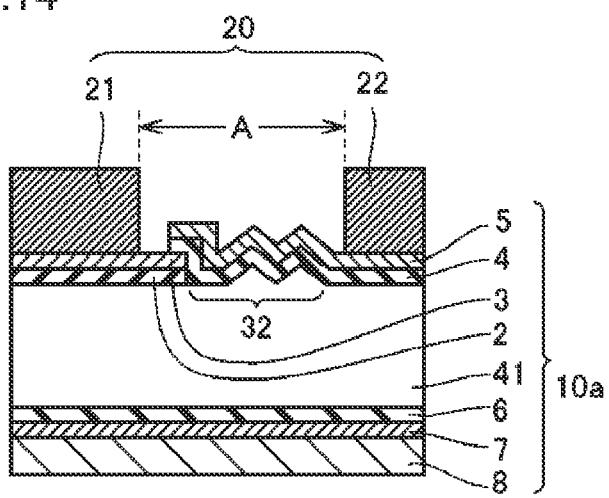
FIG. 14 is a schematic sectional view of a heterojunction back-contact cell according to Embodiment 3.

FIG. 14 shows a schematic sectional view of a heterojunction back-contact cell according to Embodiment 3 that is an example of a photoelectric conversion element according to the present invention.

The heterojunction back-contact cell according to Embodiment 3 is characterized by including a reflective section 32, placed on the back surface of a base 10a that is located in a gap region A, having irregularities instead of the reflective section 30.

In Embodiment 3, the irregularities may be those formed on any of members located on the back surface side of the base 10a located in the gap region A, that is, any of the back surface of a semiconductor substrate 41, a first i-type semiconductor film 2, a first conductivity-type semiconductor film 3, a second i-type semiconductor film 4, and a second conductivity-type semiconductor film 5. As shown in FIG. 14, a texture structure attached to the back surface of the semiconductor substrate 41 is preferable in terms of the ease of manufacturing.

Referring to FIG. 14, films located on the texture structure attached to the semiconductor substrate 41 have a similar texture structure. This is because in the case where the films are formed by a general film-forming method, the shape of each film follows the shape of the back surface of the semiconductor substrate 41, which is located directly thereunder.

The structure of the irregularities is not particularly limited and may have, for example, a shape with a series of triangular irregularities as shown in FIG. 14. Though a cross-sectional shape only is shown in FIG. 14, for example, a three-dimensional shape with a plurality of assembled triangular pyramids may be used.

The depth of the irregularities, which make up the reflective section 32, is not particularly limited. A portion of the base 10a that is located in the gap region A may have a surface profile rougher than that of other portions as observed with an electron microscope such as a SEM. Herein, the depth of the irregularities denotes the distance (the distance in a thickness direction of the base 10a) between an inside edge portion of the irregularities that most protrudes toward the inside of the base 10a (the through-thickness center of the base 10a) and an outside edge portion of the irregularities that most protrudes in a direction opposite to the inside edge portion. When the semiconductor substrate 41 has irregularities, the above distance is the distance between an inside edge portion of the semiconductor substrate 41 that most protrudes toward the inside thereof and an outside edge portion of the semiconductor substrate 41 that most protrudes in a direction opposite to the inside edge portion.

Features of the semiconductor substrate 41 are substantially the same as those described in Embodiment 1 except the shape thereof and are not repeatedly described.

(Method for Manufacturing Photoelectric Conversion Element)

Figure 15:
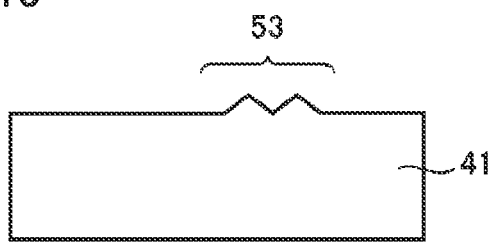
FIG. 15 is a schematic sectional view illustrating an example of a method for manufacturing the heterojunction back-contact cell according to Embodiment 3.

The heterojunction back-contact cell according to Embodiment 3 can be manufactured by the manufacturing method (however, the step of providing the reflective section 30 is excluded) described in Embodiment 1 using the semiconductor substrate 41 shown in FIG. 15.

As shown in FIG. 15, the semiconductor substrate 41 can be prepared by forming a texture structure 53 in the gap region A, which is in the back surface of the semiconductor substrate 1 according to Embodiment 1 and is interposed between a location where the first electrode layer 21 is placed and a location where the second electrode layer 22 is placed.

The texture structure 53 can be formed in such a manner that after, for example, a texture mask is formed over the light-receiving surface of the semiconductor substrate 1 described in Embodiment 1 and a texture mask is formed on a region which is in the back surface of semiconductor substrate 1 and which is not used to form the texture structure 53, the back surface of the semiconductor substrate 1 is texture-etched. The texture mask may be made of, for example, silicon nitride or silicon oxide. An etchant used for texture-etching may be, for example, an alkali solution capable of dissolving silicon. Alternatively, the texture structure 53 can be formed by partly irradiating the gap region A with a laser beam.

In the case where the semiconductor substrate 41 is used and the first i-type semiconductor film 2, the first conductivity-type semiconductor film 3, the second i-type semiconductor film 4, and the first second-conductivity-type semiconductor film 5 are formed on the back surface of the semiconductor substrate 41, the shape of each film formed on a region having the texture structure 53 follows the shape of the texture structure 53. Thus, the heterojunction back-contact cell according to Embodiment 3 is finally completed so as to have a configuration shown in FIG. 14.

(Action Effect)

In Embodiment 3, the reflective section 32, which has the irregularities, is placed in the gap region A, which is interposed between the first electrode layer 21 and the second electrode layer 22. This allows the heterojunction back-contact cell according to Embodiment 3 to have enhanced characteristics and reliability.

That is, in accordance with the heterojunction back-contact cell according to Embodiment 3, since the reflective section 32 is placed in the gap region A, light reaching the back surface of the base 10a that is located in the gap region A from the light-receiving surface of the base 10a can be reflected. In particular, light that enters the base 10a from the light-receiving surface of the photoelectric conversion element to reach the irregularities can be diffusely reflected; hence, the escape of light from the gap region A can be suppressed. Thus, the heterojunction back-contact cell according to Embodiment 3 can more efficiently use light as compared to conventional ones and therefore, as a result, is capable of having high photoelectric conversion efficiency. This allows the heterojunction back-contact cell to have enhanced characteristics and reliability.

In Embodiment 3, the reflective section 32 is preferably placed over the gap region A. That is, the reflective section 32 is preferably placed over the back surface of the base 10a that is located between the first electrode layer 21 and the second electrode layer 22. This enables the photoelectric conversion efficiency to be further increased.

According to Embodiment 3, the number of constituent members is less as compared to that described in Embodiments 1 and 2 (the number of parts need not be increased from a photoelectric conversion element with a conventional configuration) and therefore manufacturing costs can be reduced.

Embodiment 3 is substantially the same as Embodiment 1 except having the reflective section 32 instead of the reflective section 30 and therefore a similar description is not repeated.

[Embodiment 4]

(Configuration of Photoelectric Conversion Element)

Figure 16:
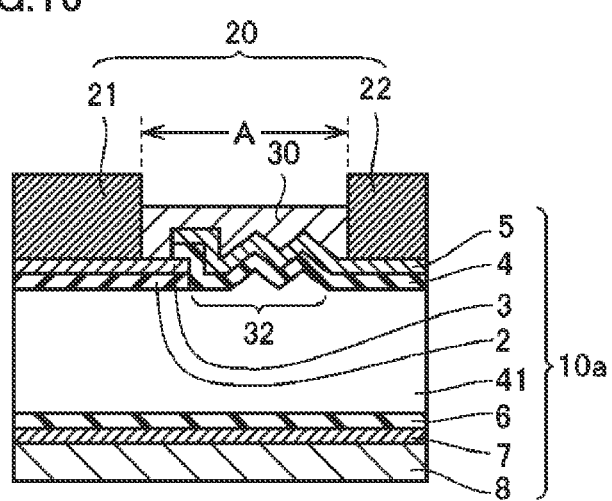
FIG. 16 is a schematic sectional view of a heterojunction back-contact cell according to Embodiment 4.

FIG. 16 shows a schematic sectional view of a heterojunction back-contact cell according to Embodiment 4 that is an example of a photoelectric conversion element according to the present invention.

The heterojunction back-contact cell according to Embodiment 4 is characterized by including a reflective section 30 composed of an insulating layer and a reflective section 32 having irregularities. That is, the heterojunction back-contact cell according to Embodiment 4 includes the reflective section 30 described in Embodiment 1 and the reflective section 32 described in Embodiment 3.

(Method for Manufacturing Photoelectric Conversion Element)

The heterojunction back-contact cell according to Embodiment 4 can be manufactured by the manufacturing method described in Embodiment 1 using the semiconductor substrate 41 shown in FIG. 15.

(Action and Effect)

In Embodiment 4, the reflective section 30, which is composed of the insulating layer, and the reflective section 32, which has the irregularities, are placed in a gap region A interposed between a first electrode layer 21 and a second electrode layer 22. In particular, in Embodiment 4, the reflective section 30 is placed in a region which is the gap region A and which is surrounded by surfaces of the first and second electrode layers 21 and 22 that face each other and the back surface of the base 10a that is located between the first and second electrode layers 21 and 22. Furthermore, the reflective section 32, which has the irregularities provided on the back surface side of the semiconductor substrate 41, is placed in the gap region A. This enables the reflective section 32 and the reflective section 30 to reflect light reaching the back surface of the base 10a that is located in the gap region A from the light-receiving surface of the base 10a, thereby allowing the heterojunction back-contact cell according to Embodiment 4 to have further enhanced characteristics and reliability.

In Embodiments 1 to 4, the case where a first conductivity type is a p-type and a second conductivity type is an n-type has been described. The first conductivity type and the second conductivity type may be opposite to each other. When the first conductivity type is an n-type, the second conductivity type is a p-type.

[Appendices]

(1) According to a first embodiment of the present invention, the following element can be provided: a photoelectric conversion element including a base including a semiconductor substrate, a first i-type semiconductor film placed on a portion of a surface of the semiconductor substrate, a first conductivity-type semiconductor film placed on the first i-type semiconductor film, a second i-type semiconductor film placed on another portion of the surface thereof, and a second conductivity-type semiconductor film placed on the second i-type semiconductor film; an electrode section including a first electrode layer placed on the first conductivity-type semiconductor film and a second electrode layer placed on the second conductivity-type semiconductor film; and a reflective section placed in a gap region interposed between the first electrode layer and the second electrode layer. In the first embodiment of the present invention, since the reflective section is placed in the gap region, light reaching the back surface of the base that is located in the gap region from the light-receiving surface of the base can be reflected. Thus, a heterojunction back-contact cell has enhanced characteristics and reliably.

(2) In the first embodiment of the present invention, the reflective section is preferably an insulating layer placed in the gap region. This enables the effect of reflecting light in the gap region to be increased.

(3) In the first embodiment of the present invention, the reflective section preferably is irregularities attached to a surface of the base that is located in the gap region. This enables light to be diffusely reflected in the gap region.

(4) In the first embodiment of the present invention, the irregularities are preferably a texture structure attached to the semiconductor substrate. This enables the irregularities to be readily formed such that the irregularities have a desired shape.

Embodiments of the present invention have been described above. Appropriately combining configurations of the above-mentioned embodiments has been previously planned.

The embodiments disclosed herein are for exemplification only and are to be construed as non-limitative. The scope of the present invention is defined by the appended claims rather than the foregoing description and is intended to include all modifications within the sense and scope equivalent to the appended claims.

INDUSTRIAL APPLICABILITY

The present invention is applicable to a photoelectric conversion element and a method for manufacturing the photoelectric conversion element. In particular, the present invention is applicable to a solar cell such as a heterojunction back-contact cell and a method for manufacturing the same.

REFERENCE SIGNS LIST 1, 41 Semiconductor substrate
2 First i-type semiconductor film
3 First conductivity-type semiconductor film
4 Second i-type semiconductor film
5 First second-conductivity-type semiconductor film
6 Third i-type semiconductor film
7 Second second-conductivity-type semiconductor film
8 Antireflective film
10, 10a Base
12, 13 Etching mask
14 Metal layer
20 Electrode section
21 First electrode layer
22 Second electrode layer
30, 31, 32 Reflective section
51, 52 Stack
53 Texture structure

The invention claimed is:

1. A photoelectric conversion element comprising:
a base including:
 a semiconductor substrate,
 a first i-type semiconductor film placed on a portion of a surface of the semiconductor substrate,
 a first conductivity-type semiconductor film placed on the first i-type semiconductor film,
 a second i-type semiconductor film placed on another portion of the surface thereof, and
 a second conductivity-type semiconductor film placed on the second i-type semiconductor film;
an electrode section including
 a first electrode layer placed on the first conductivity-type semiconductor film and
 a second electrode layer placed on the second conductivity-type semiconductor film; and
a reflective section placed in a gap region interposed between the first electrode layer and the second electrode layer, wherein
the reflective section has an insulating layer, and
the reflective section has two planar surfaces, both planar surfaces are parallel with the surface of the semiconductor substrate and both planar surfaces are not co-planar and both planar surfaces are directly in contact with the second conductivity-type semiconductor film.

2. The photoelectric conversion element according to claim 1, wherein the reflective section is in contact with a surface of the base that is located in the gap region.

3. The photoelectric conversion element according to claim 1, each of semiconductor film of the first i-type semiconductor film, the second i-type semiconductor film, the first conductive-type semiconductor film and the second conductivity-type semiconductor film is amorphous silicon film.

4. The photoelectric conversion element according to claim 1, the gap region is surrounded by surfaces of the first and second electrode layers that face each other and a back surface of the base that is located between the first and second electrode layers.

5. The photoelectric conversion element according to claim 4, the first conductivity-type semiconductor film and the second conductivity-type semiconductor film are located above the back surface of the base, and these are in direct contact with the reflective section.

6. The photoelectric conversion element according to claim 1, the reflective section has a refractive index different from that of each of the first conductivity-type semiconductor film and the second conductivity-type semiconductor film.

7. The photoelectric conversion element according to claim 1, the reflective section has a refractive index less than that of each of the first conductivity-type semiconductor film and the second conductivity-type semiconductor film.

* * * * *